United States Patent [19]

Strong

[11] Patent Number: 4,588,983

[45] Date of Patent: May 13, 1986

[54] INSTANTANEOUS GAIN CHANGING ANALOG TO DIGITAL CONVERTER

[75] Inventor: Norman H. Strong, Seattle, Wash.

[73] Assignee: John Fluke Mfg. Co., Inc., Everett, Wash.

[21] Appl. No.: 744,909

[22] Filed: Jun. 17, 1985

Related U.S. Application Data

[63] Continuation of Ser. No. 443,673, Nov. 22, 1982.

[51] Int. Cl.$^4$ ............................................. H03K 13/02
[52] U.S. Cl. ........................... 340/347 NT; 324/99 D; 340/347 AD; 340/347 M; 340/347 CC
[58] Field of Search .... 340/347 M, 347 AD, 347 NT, 340/347 CC; 324/99 D, 115

[56] References Cited

U.S. PATENT DOCUMENTS

| | | | |
|---|---|---|---|
| 3,448,446 | 6/1969 | James et al. | 340/347 AD |
| 3,582,777 | 6/1971 | Wunderman | 324/115 X |
| 3,895,376 | 7/1975 | Uchida | 340/347 AD X |
| 3,906,486 | 9/1975 | Phillips | 340/347 AD X |
| 4,337,517 | 6/1982 | Nickel et al. | 324/99 D |

OTHER PUBLICATIONS

The Engineering Staff of Analog Devices, Inc., Analog-Digital Conversion Handbook, 6/1972, pp. I-2 & I-3; III-1 to III-5.

*Primary Examiner*—T. J. Sloyan
*Attorney, Agent, or Firm*—Mikio Ishimaru; Stephen A. Becker

[57] ABSTRACT

In a dual slope analog to digital converter, the input amplifier has an input selectively connectable to an unknown analog source or a known opposite polarity analog source. The output of the amplifier is directly or indirectly connectable to its other input to change the gain of the output. A microprocessor controls the converter to sequentially connect the unknown analog source, instantaneously change the output connection to change gain where appropriate, and connect the known analog source.

5 Claims, 1 Drawing Figure

U.S. Patent  May 13, 1986  4,588,983
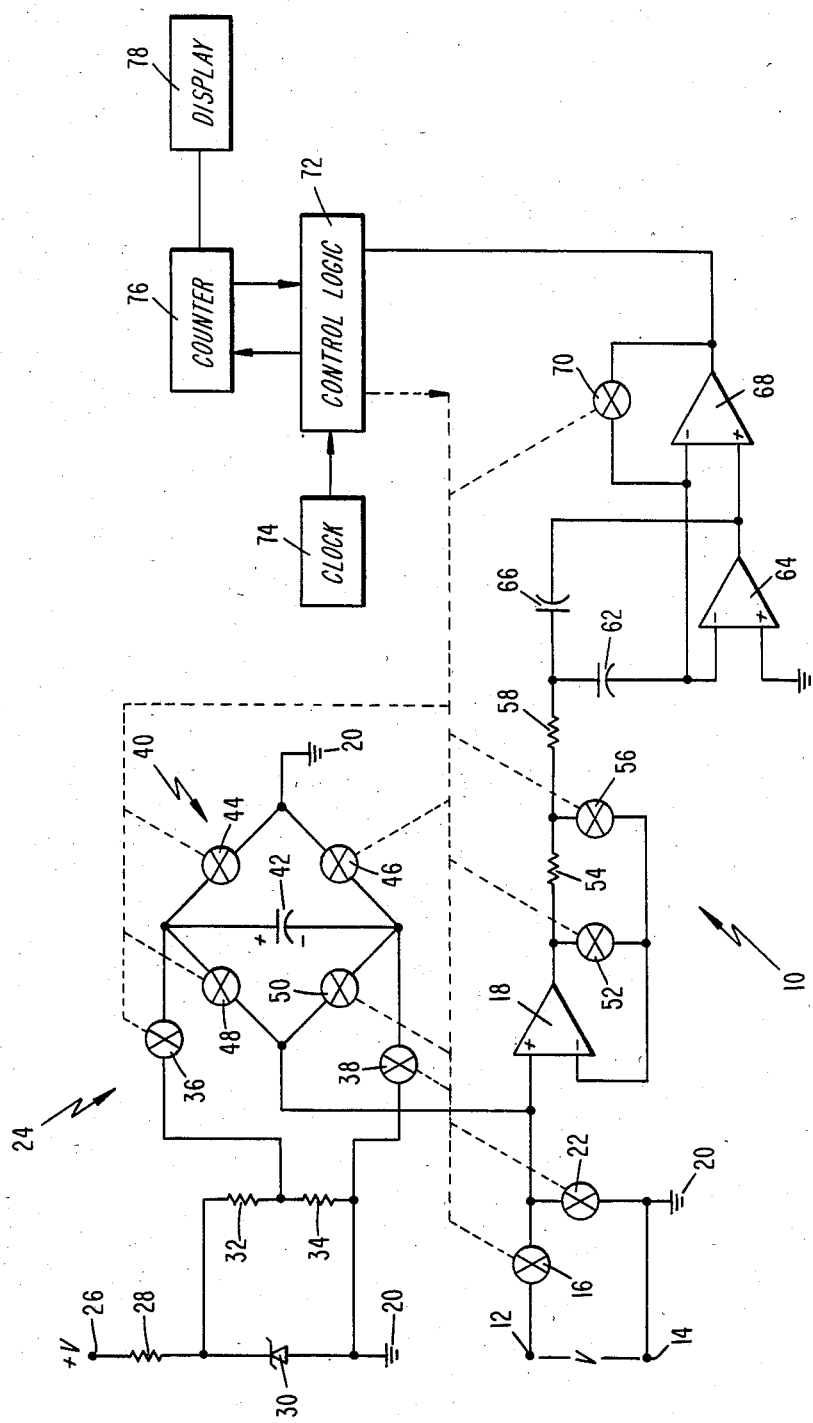

INSTANTANEOUS GAIN CHANGING ANALOG TO DIGITAL CONVERTER

This application is a continuation of application Ser. No. 443,673, filed Nov. 22, 1982.

FIELD OF THE INVENTION

The present invention pertains generally to analog and digital converters, and more particularly, to converters operating over a wide range of inputs such that different gains are required internally and to an internal gain changing method.

BACKGROUND OF THE INVENTION

In the past, the change-over from one range to another in a dual-slope analog to digital converter was accomplished by changing the deintegrate reference voltage to affect the converter's internal gain. For example, a 2 volt range would use a 1 volt reference and a 0.2 volt range would use a 0.1 volt reference (in A/D converters using 20,000 clock counts for the maximum period of the deintegrate cycle). The buffer and/or integrator gain was changed so as to keep the internal signal level up.

The use of very low reference voltages in conventional A/D converters results in susceptability of the meter to noise, and further, since the integration period during the deintegrate cycle is not synchronous with the AC line, the converter is quite sensitive to AC line pick-up. For example, for a 0.1 volt reference in 20,000 clock counts, the sensitivity at full scale is 5 microvolts per digit which yields twice the noise sensitivity. Thus, conventional A/D converters are generally limited to using reference voltages larger than 0.1 volt.

In conventional A/D converters, the gain cannot be changed without changing the zero offset. This is because the change of gain also changes the effect of the zero offset scheme.

SUMMARY

The present invention provides an A/D converter in which the gain can be instantaneously changed within a conversion cycle without changing the zero offset.

The present invention further provides an A/D converter in which no additional noise is introduced into the converter during the deintegrate cycle.

The present invention further provides an A/D converter in which the reference voltage circuitry and the auto zeroing circuitry are separated.

The present invention further provides an A/D converter in which only one, high voltage reference is required for a large range of input ranges.

SUMMARY OF THE INVENTION

Range switching circuitry is provided within an integrating analog to digital converter of a type wherein an input signal is first integrated for a predetermined time and then deintegrate to a base level. The duration of time required to deintegrate the input to a fixed base level, such as ground, corresponds to the magnitude of the input signal. The range switching circuitry, between the input of the converter and the integrator, includes an amplifier controllable by a logic means to amplify the input signal selectively with a first or second gain, depending upon the amplitude range of the analog input signal, and thereafter amplify the reference signal with only the second gain. To cause amplifier offset to be independent of gain, the gain of the amplifier is controlled by feeding its output signal directly, or through a resistor, back to the input of the amplifier, and thereby be independent of output zeroing.

The above and additional advantages of the present invention will become apparent to those skilled in the art from a reading of the following detailed description when taken in conjunction with the accompanying drawing.

BRIEF DESCRIPTION OF THE DRAWING

The drawing is a schematic, partially in block form, of the present invention.

DESCRIPTION OF THE PREFERRED EMBODIMENTS

Referring now to the drawing, therein is shown an A/D converter 10 having a pair of input terminals 12 and 14. The input terminal 12 is connected by a normally nonconducting, electronic switch, designated the integrate switch 16 to the positive input of a buffer amplifier 18. The input terminal 14 is connected to ground 20 and to the positive input of the buffer amplifier 18 by a normally nonconducting electronic switch, designated the auto zero switch 22. Reference voltage circuitry 24 is also connected to the positive input of the buffer amplifier 18.

The reference voltage circuitry 24 consists of a single predetermined voltage $+V$ applied to a terminal 26 which is connected to a resistor 28. The resistor 28 is connected to a band gap reference diode 30 which is connected to the ground 20. Across the reference diode 30 are a pair of resistors 32 and 34. The junction between the resistors 32 and 34 is connected to a normally nonconducting, electronic switch designated as auto zero switch 36. The junction of the resistor 34 connected to the ground 20 is further connected to a normally nonconducting, electronic switch designated as auto zero switch 38.

The auto zero switches 36 and 38 are connected to a bridge circuit 40. The bridge circuit 40 includes a reference voltage capacitor 42 connected at opposite ends to the auto zero switch 36 and the auto zero switch 38. Normally nonconducting, electronic switches designated as deintegrate switches 44 and 46, respectively, in the arms of the bridge circuit 40 connect one end of capacitor 42 and normally nonconducting, electronic switches designated as deintegrate switches 48 and 50, respectively, in the other arms of the bridge circuit 40 connect the other end of capacitor 42 to the positive input of the buffer amplifier 18.

The buffer amplifier 18 has its output connected to a normally nonconducting, electronic switch designated as the high range integrate/deintegrate switch 52 which in its conducting state is conductively connected to the negative input of the buffer amplifier 18. The output of the buffer amplifier 18 is further connected to a resistor 54 which is connected to a normally nonconducting, electronic switch designated as the low range integrate/auto zero switch 56 which in its conducting state is also conductively connected to the negative input of the buffer amplifier 18. The resistor 54 is further connected to a resistor 58 to modify the output of the buffer amplifier 18.

Integrator circuitry 60 is connected to the resistor 58. The integrator circuitry 60 includes an auto zero capacitor 62 connected to the negative input of an integrator amplifier 64 and an integrator capacitor 66 which is connected to the output of the integrator amplifier 64. The positive input of the integrator amplifier 64 is connected to the ground 20. The output of the integrator amplifier 64 is further connected to the positive input of the comparator 68 whose negative input is connected between the auto zero capacitor 62 and the integrator amplifier 64.

The comparator 68 is further bridged by a normally nonconducting, electronic switch designated as auto zero switch 70.

The output of the compartor 68 is sensed by control logic 72 which could be any conventional logic circuitry which would be obvious to those skilled in the art to perform the operations hereinafter described. In the preferred embodiment, logic 72 is a conventional microprocessor based circuit operating under the direction of a simple program of a type well-known to those skilled in the art.

The logic 72 controls the conductive state of the auto zero switches 22, 36, 38, 56, and 70; and the deintegrate switches 44, 46, 48, 50, and 52; as well as the integrate switch 16.

The logic 72 has connected to it a clock 74 which outputs digital pulses or periods. The output of the clock 74 is selectively provided to a counter 76 which starts counting when the deintegrate of the A/D conversion begins and stops counting when a transition of the comparator 68 occurs. Under the control of the logic 72, the counter 76 will output its count to a conventional buffer and digital display 78.

In operation, the A/D converter is first zeroed by the logic 72 causing the auto zero switches to become conductive. The conductive state of the auto zero switch 22 causes the positive input of the buffer amplifier 18 to go to zero voltage by being conductively connected to the ground 20 which causes the negative input to go to zero voltage less the offset voltage due to the buffer amplifier 18 via the low range integrate/auto zero switch 56. The conductive state of the auto zero switch 70 causes the auto zero capacitor 62 to attain a voltage which causes the integrator amplifier 64 to drive the comparator 68 output also to zero.

In the reference voltage circuitry 24, when the auto zero switches are conductive, the reference voltage across the resistor 34 will be imposed on the reference voltage capacitor 42. This reference voltage will be retained by the capacitor 42 because the deintegrate switches 44, 46, 48, and 50 are nonconductive at this time.

After the auto zero is complete as determined by the settling of compartor 68, the auto zero switches are rendered nonconductive.

Based on the expected analog input, the appropriate high or low range is selected and set by the logic 72 by rendering conductive either the high range integrate/-deintegrate switch 52 or the low range integrate/auto zero switch 56, respectively. Since the voltages at switches 52 and 56 are both equal, conditions for zero offset are not disturbed by this choice. The unknown analog input voltage of either polarity is then imposed across the input terminals 12 and 14, and the integrate switch 16 is rendered conductive.

The input voltage is imposed on the positive input of the buffer amplifier 18 by rendering the integrate switch 16 conductive. The output of the buffer amplifier 18 is provided to the integrator circuitry 60 and thence to the compartor 68 and the logic 72.

When the integrate portion of the A/D conversion is complete, as determined by the accumulation of a fixed number of clock periods in counter 76, the logic 72 assures the proper gain at the buffer amplifier 18 instantaneously by assuring that the low range integrate/auto zero switch 56 is rendered nonconductive and that the high range integrate/deintegrate switch 52 is conductive. If the high range had previously been selected, no gain change will occur.

Simultaneously, the logic 72 determines the polarity of the input voltage and affects the bridge circuit 40 by causing the deintegrate switches 44 and 50 to become conductive for a positive polarity input or the deintegrate switches 46 and 48 to become conductive for a negative input voltage. As appropriate, the negative or positive reference voltage from the bridge circuit 40 which had earlier been imposed on the reference voltage capacitor 42 will be applied to the positive input of the buffer amplifier 18. The deintegrate portion of the A/D conversion then proceeds as the reference voltage is integrated (deintegrated) to the zero voltage level and causes a transition of the comparator 68.

In summary, as well known to those skilled in the art, a dual slope A/D converter operates by integrating an unknown input voltage from zero voltage for a predetermined period of time, integrating an opposite polarity reference voltage back to the zero voltage, and measuring the time in digital pulses required to integrate the reference. In the present invention, the gain is instantaneously changed, when necessary, between the end of the integration of the input and the beginning of the integration of the reference.

As many possible embodiments may be made of the present invention without departing from the scope thereof, it is to be understood that all matters set forth herein or shown in the accompanying drawing is to be interpreted in an illustrative and not a limiting sense.

I claim:

1. In an integrating analog to digital converter of a type comprising an input for receiving an analog input signal; reference signal means for generating a reference signal; clock means for generating a clock signal; integrator means for integrating selectively said input signal and said reference signal; comparator means responsive to said integrator means and to a base signal for generating a comparator signal; an output for providing a digital signal corresponding to said input signal; and controller means for applying said input signal to said integrator means for integration in a first direction for a predetermined time, applying the reference signal to said integrator means for integration in an opposite direction to a base level, counting said clock signal generated during said integration in said opposite direction to provide a count and applying said count to said output; an improvement comprising:

range means in circuit between said input and said integrator means, said range means including:
    first and second attenuator means;
    means for amplifying a signal applied to said range means selectively with first and second gains, and amplifying means tending to have an offset;
    wherein said amplifying means comprises an amplifier having an inverting input and an output, and means for (1) connecting said output along a first path to said inverting input to establish said first gain and (2) connecting said output through a second path including said first attenuator means to said inverting input to establish said second gain;

zeroing means coupled to said input and said integrator means during an auto-zero mode for cancelling any offset of said amplifying means, whereby substantially no current flows through said first and second attenuator means; and logic means for controlling said range means to amplify said input analog signal with said first and second gains, selectively, as a function of the expected analog input signal amplitude range;

said offset thereby being independent of the gain of said amplifying means.

2. An improvement as recited in claim 1, wherein said amplifying means is coupled between said input and said integrator means, and wherein said range means includes said first and second attenuator means in series between said amplifying means and said integrator means, said zeroing means includes a first switch connected between said input and a source of said base signal, a second switch connected between a junction of said first and second attenuator means and an input of said amplifying means and a third switch connected between an input and an output of said comparator means, whereby when said first, second and third switches are closed during said auto-zero mode, current flow through said first and second attenuator means is zero and the offset of said amplifying means is thereby independent of gain thereof.

3. An improvement as recited in claim 2, wrein said first and second attenuating means comprise resistors.

4. An improvement as recited in claim 2, wherein said zeroing means further includes an offset reference capacitor coupled between said range means and said integrator means.

5. An analog to digital converter having a switchable gain, comprising:

an input for receiving an analog signal;

reference means for providing a reference signal;

amplifier means for amplifying the input analog signal by a predetermined gain;

high-range switching means for establishing a first feedback circuit with said amplifier means to provide a first amplifier gain;

low range switching means for establishing a second feedback loop with said amplifier means to provide a second amplifier gain;

integrator means for integrating an output of said low range and high range switching means;

comparator means responsive to an output of said integrator means and to the reference signal for developing a comparator signal;

clock means for generating clock signals at a predetermined rate;

counter means responsive to said comparator means for counting said clock signals and generating an output digital signal that is proportional to said input analog signal; and zeroing means in circuit with said input, said amplifier means and said comparator means for cancelling any offset associated with said amplifier means, said zeroing means including (a) switch means operative during an auto-zero mode for applying a zero level input to said amplifier means and for bypassing an input of said comparator means, and (b) an auto-zero capacitor storing an offset signal from said amplifier means and applying said offset signal to said integrator means, current in said feedback loop of said amplifier means thereby being zero, whereby amplifier offset is independent of amplifier gain; and logic means for controlling said switch means.

* * * * *